United States Patent
Wu

(10) Patent No.: US 8,741,036 B2
(45) Date of Patent: Jun. 3, 2014

(54) COMPOSITION OF PALLADIUM UNSATURATED ORGANOAMINE COMPLEX AND PALLADIUM NANOPARTICLES

(75) Inventor: Yiliang Wu, Oakville (CA)

(73) Assignee: Xerox Corporation, Norwalk, CT (US)

( * ) Notice: Subject to any disclaimer, the term of this patent is extended or adjusted under 35 U.S.C. 154(b) by 344 days.

(21) Appl. No.: 13/364,961

(22) Filed: Feb. 2, 2012

(65) Prior Publication Data

US 2013/0200312 A1  Aug. 8, 2013

(51) Int. Cl.
*C23C 18/44* (2006.01)
*B05D 3/02* (2006.01)
*B05D 5/12* (2006.01)

(52) U.S. Cl.
USPC ... 106/1.21; 106/1.28; 427/126.1; 427/383.1; 427/376.7

(58) Field of Classification Search
USPC ........ 106/1.21, 1.28; 427/126.1, 383.1, 376.7
See application file for complete search history.

(56) References Cited

U.S. PATENT DOCUMENTS

| | | | |
|---|---|---|---|
| 5,894,038 A | 4/1999 | Sharma et al. | |
| 6,572,673 B2 | 6/2003 | Lee et al. | |
| 6,878,184 B1 | 4/2005 | Rockenberger et al. | |
| 7,315,068 B2 | 1/2008 | Haubrich et al. | |
| 8,110,254 B1 | 2/2012 | Sharma et al. | |
| 8,361,350 B2 | 1/2013 | Wu et al. | |
| 8,419,822 B2 | 4/2013 | Li | |
| 8,568,824 B2 | 10/2013 | Wu et al. | |
| 8,574,665 B2 | 11/2013 | Wu et al. | |
| 8,613,796 B1 | 12/2013 | Wu et al. | |
| 2005/0005820 A1* | 1/2005 | Etheridge | 106/287.3 |
| 2009/0148600 A1 | 6/2009 | Li et al. | |
| 2009/0297802 A1* | 12/2009 | Sastry et al. | 428/209 |
| 2011/0059233 A1* | 3/2011 | Liu et al. | 427/123 |
| 2011/0174524 A1* | 7/2011 | Sharma et al. | 174/254 |
| 2013/0202795 A1* | 8/2013 | Wu | 106/1.21 |
| 2013/0221288 A1 | 8/2013 | Liu et al. | |

FOREIGN PATENT DOCUMENTS

WO    WO 2011/119961 A2    9/2011

OTHER PUBLICATIONS

Office Action dated Oct. 23, 2013 issued in Canadian Patent Application No. 2,804,136.
Office Action dated Dec. 27, 2013 issued in Canadian Patent Application No. 2,803,519.
Office Action dated Jan. 14, 2014 issued in U.S. Appl. No. 13/365,001.
U.S. Appl. No. 13/290,825, filed Nov. 8, 2011.
U.S. Appl. No. 13/153,856, filed Jun. 6, 2011.
U.S. Appl. No. 11/950,450, filed Dec. 5, 2007.
U.S. Appl. No. 13/365,001, filed Feb. 2, 2012.

* cited by examiner

*Primary Examiner* — Helene Klemanski
(74) *Attorney, Agent, or Firm* — Oliff PLC

(57) ABSTRACT

A palladium first composition is disclosed, including a palladium salt and an unsaturated organoamine, wherein the composition is substantially free of water, and wherein the first composition forms a second composition including stable palladium nanoparticles and a palladium unsaturated organoamine. The composition permits the use of solution processing methods to form a palladium layer on a wide variety of substrates, including in a pattern to form circuitry or pathways for electronic devices.

22 Claims, 2 Drawing Sheets

COMPOSITION OF PALLADIUM UNSATURATED ORGANOAMINE COMPLEX AND PALLADIUM NANOPARTICLES

BACKGROUND

The present disclosure relates to compositions and processes for depositing and forming palladium layers on various substrates. The compositions may be flowable solutions or pastes, for example, and used to coat and/or print objects such as electronic devices or components thereof by solution deposition processes including spin coating, dip coating, inkjet printing and screen printing.

Palladium (Pd) is a rare metal with many unique properties, resulting in its widespread use. For example, palladium is used in catalytic converters of automobiles to convert combustion byproducts into less harmful substances. Palladium is also used in many electronics devices, ceramic capacitors, fuel cells, and so on. Palladium layers/structures are conventionally formed in such devices by electroplating, sputtering, or chemical vapor deposition (CVD).

It would be desirable to use lower-cost approaches to form palladium structures. There is a need for solution-processable compositions that can be used for palladium deposition.

SUMMARY

Disclosed is a composition comprising palladium nanoparticles that may be used to form palladium layers and/or structures on a variety of substrates and methods for forming the same. These compositions are useful for coating and printing substrates, such as in a pattern to form a palladium layer, and can be used for fabricating electronically conductive elements, pathways, and/or circuits of electronic devices. The resulting palladium layers and/or structures are substantially uniform and exhibit high conductivity and good adhesion.

A process for forming a composition comprising palladium nanoparticles includes warming a first composition comprising at least one palladium salt and at least one unsaturated organoamine to form a second composition comprising stable palladium nanoparticles and at least one palladium unsaturated organoamine complex, wherein the first composition is substantially free of an additional reducing agent.

Also, a composition comprising at least one palladium unsaturated organoamine complex and stable palladium nanoparticles is described, which is formed by a process including warming a first composition comprising at least one palladium salt and at least one unsaturated organoamine to form a second composition comprising the at least one palladium unsaturated organoamine complex and palladium nanoparticles, wherein the first composition is substantially free of an additional reducing agent.

A method for forming a palladium layer on a substrate is also described, the method including warming a first composition comprising at least one palladium salt and at least one unsaturated organoamine to form a second composition comprising stable palladium nanoparticles and at least one palladium unsaturated organoamine complex, solution depositing the second composition upon the substrate; and heating the second composition on the substrate to form the palladium layer.

Also, a palladium layer is described. The palladium layer is formed from a composition comprising both palladium nanoparticles and palladium unsaturated organoamine complex. The palladium layer has a conductivity at least 1000 S/cm. The palladium layer has a surface roughness less than 10 nm.

BRIEF DESCRIPTION OF THE DRAWINGS

The following is a brief description of the drawings, which are presented for the purposes of illustrating an example embodiment disclosed herein.

EMBODIMENTS

Figure 1:
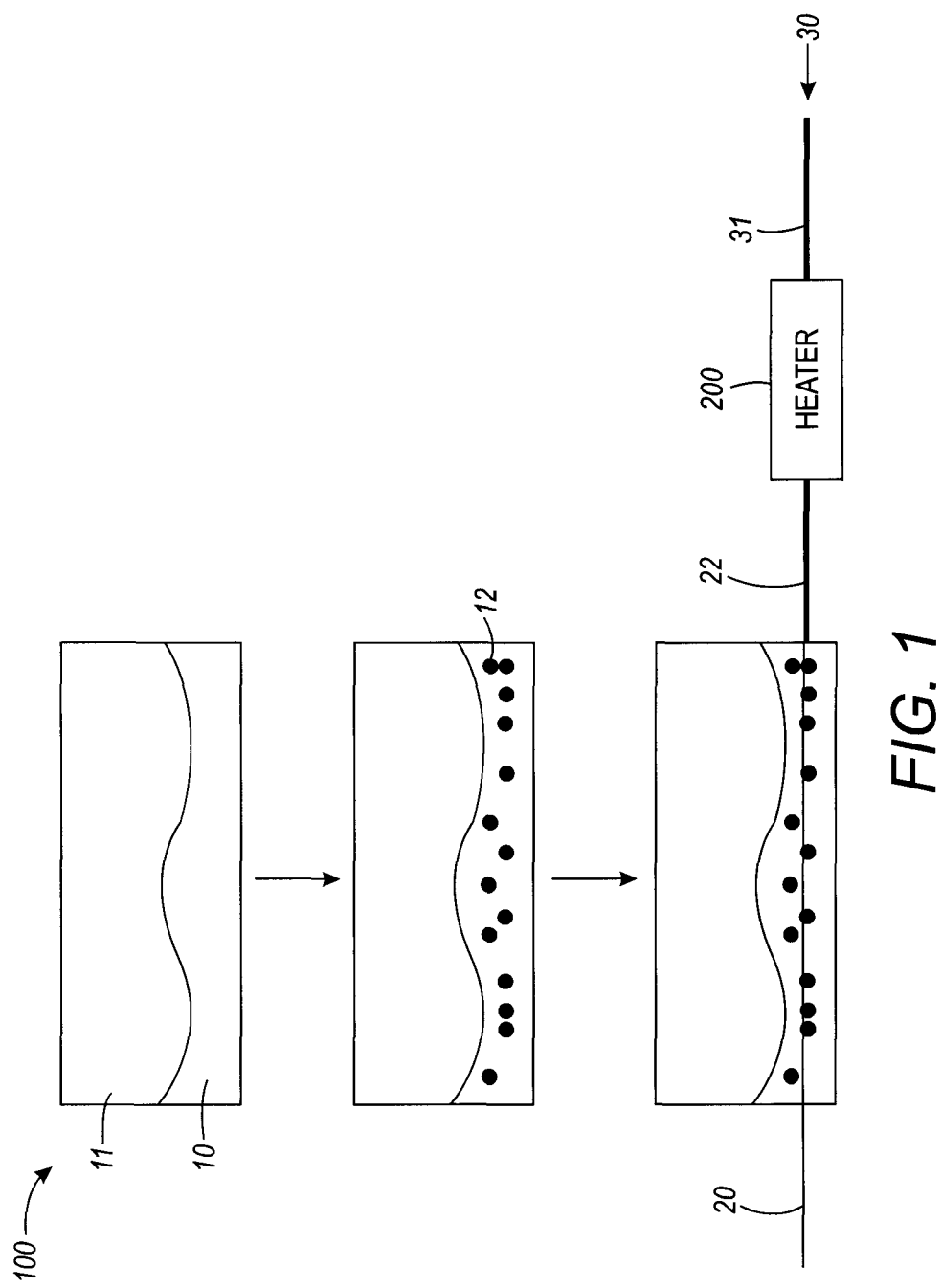
FIG. 1 is a schematic diagram showing the process of coating a substrate, for example, a wire, according to the present disclosure.

The term "room temperature" refers to a temperature of about 20° C. to about 25° C.

The modifier "about" used in connection with a quantity is inclusive of the stated value and has the meaning dictated by the context (for example, it includes at least the degree of error associated with the measurement of the particular quantity). When used in the context of a range, the modifier "about" should also be considered as disclosing the range defined by the absolute values of the two endpoints. For example, the range "from about 2 to about 4" also discloses the range "from 2 to 4."

The use of the singular terms "a", "an", and "the" should be construed to include plural referents as well, unless clearly indicated otherwise by the context. Put another way, these singular terms should be construed as "at least one".

The term "unsaturated" means a state in which not all of the available valence bonds along an alkly chain are satisfied, meaning that at least 2 carbon atoms are connected by at least one double bond. Thus, the phrase "unsaturated organoamine" refers to organoamines that include at least one carbon-carbon double bond that is not part of an aromatic ring.

The term "organo" as used herein refers to, for example, the presence of carbon atoms, although the organo group may include heteroatoms such as, for example, nitrogen, oxygen, sulfur, phosphorus, silicon, fluorine, chlorine, bromine, iodine and the like. Further, the organo group may be linear, cyclic, branched and the like.

In addition, palladium salt is a molecular compound. Pd—Pd bonds may be present in the molecular compound. However, the palladium salt is not a nanoparticle or similar material. The palladium atom in the salt is not zero valent, while palladium atoms are zero valent in the nanoparticle form. For example, the palladium in the palladium salt is Pd (II) while the palladium in the palladium nanoparticles is Pd (0).

A process for forming a composition comprised of palladium nanoparticles is described, which includes warming a first composition comprising at least one palladium salt and at least one unsaturated organoamine to form a second composition comprising palladium nanoparticles and at least one palladium unsaturated organoamine complex. The process may exclude, for example, isolating the palladium nanoparticles after warming the first composition. In other words, the palladium nanoparticles are formed in-situ together with the palladium unsaturated organoamine complex. The second composition is not formed by mixing two separated entities, the palladium nanoparticle and the palladium unsaturated organoamine complex, together.

The first composition may, for example, not contain any water. However, this does not require an absolute absence of water. Some residual water may be present in the first composition from the various ingredients or from ambient/atmospheric conditions.

The palladium salt may be any palladium salt. For example, the palladium salt may be a salt of the formula $$Pd(X)_2,$$

where X is any counter ion to palladium, and mixtures thereof. The palladium salt may be selected from, for example, a palladium carboxylate, for example, palladium acetate, palladium chloride, palladium nitrate, palladium sulfate, palladium iodide, palladium cyanide, ethylenediamine palladium chloride, tetraaminepalladium bromide, bis(acetylacetonato)palladium, diamine dinitro palladium, and mixtures thereof. For example, the salt may be selected from any palladium compound in which the counter ion is $R'COO^-$, $Cl^-$, $Br^-$, $I^-$, $NO_3^-$, $SO_4^{2-}$, $HCO_3$ cyanide, acetylacetonato, nitro, or a mixture thereof, wherein R' is a hydrocarbon group comprising 1 to about 18 carbon atoms. In embodiments, the palladium salt is palladium acetate.

The palladium salt may compose from about 1 to about 50 weight percent (wt %) of the first composition, for example, the palladium salt makes up from about 5 wt % to about 40 wt % of the first composition, or from about 5 wt % to about 30 wt % of the first composition.

The unsaturated organoamine is any unsaturated organoamine that contains at least 2 carbons connected by at least one double bond or at least one triple bond. The unsaturated organoamine may be any unsaturated organoamine of the formula:

$$R^1\text{—}CH\text{=}CH\text{—}R^2\text{—}NH_2,$$

wherein $R^1$ represents a hydrogen or a hydrocarbon group having from about 1 carbon atom to about 25 carbon atoms, and $R^2$ represents a hydrocarbon group having from about 1 to about 25 carbon atoms, wherein the hydrocarbon group of $R^1$ and/or $R^2$ is independently selected from the group consisting of a substituted or unsubstituted alkyl, alkenyl, alkynyl, aryl and mixtures thereof. For example, the number of carbon atoms in the range may be from about 4 to about 20 carbon atoms, or from about 8 to about 18 carbon atoms. For example, $R^1$ may be hydrogen. In addition, $R^1$ and/or $R^2$ may be alkyl, an alkenyl, an alkynyl, and an aryl. Hydrogen atoms on $R^1$ or $R^2$ may be substituted with another functional group such as —CHO, —OH, halogen, and the like. For example, the unsaturated organoamine may be oleylamine, allylamine, geranylamine, N-methylallylamine, diallylamine, 2-(1-cyclohexenyl)ethylamine, 3-pyrroline, 1,2,3,6-tetrahydropyridine, N-methyl-2-methylallylamine, and the like, or mixtures thereof. In embodiments, the organoamine is oleylamine.

Generally, the unsaturated organoamine may be any primary, secondary, or tertiary amine. However, the organoamine may preferably be a primary amine. The unsaturated organoamine can also be a monoamine, diamine, or polyamine. Combinations of more than one unsaturated organoamine are also contemplated. More specifically, the unsaturated organoamine may contain one, two, or more amine groups of Formula (I):

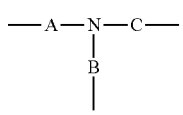

Formula (I)

wherein A, B, and C are independently selected from hydrogen and an organic group, wherein and at least one of A, B, or C is an organic group. When the tertiary amine contains more than one such amine group, the nitrogen atoms are not directly bonded to each other. An organic group contains at least one carbon atom. Example organic groups include alkyl, aryl, substituted alkyl, substituted aryl, alkenyl and alkynyl. Any two of organic groups A, B and C may form a cyclic structure.

The term "alkyl" refers to a radical composed entirely of carbon atoms and hydrogen atoms which is fully saturated and of the formula $-C_nH_{2n+1}$. The alkyl radical may be linear, branched, or cyclic, wherein n represents a number greater than or equal to 1.

The term "aryl" refers to an aromatic radical composed entirely of carbon atoms and hydrogen atoms. When aryl is described in connection with a numerical range of carbon atoms, it should not be construed as including substituted aromatic radicals. For example, an aryl containing from 6 to 10 carbon atoms should be construed as referring to a phenyl group (6 carbon atoms) or a naphthyl group (10 carbon atoms) only, and should not be construed as including a methylphenyl group (7 carbon atoms).

The term "substituted" refers to at least one hydrogen atom on the named radical being substituted with another functional group, such as halogen, hydroxyl, mercapto (—SH), —CN, —$NO_2$, —COOH, and —$SO_3H$. An example of a substituted alkyl group is a perhaloalkyl group, wherein one or more hydrogen atoms in an alkyl group are replaced with halogen atoms, such as fluorine, chlorine, iodine, and bromine. Besides the aforementioned functional groups, an aryl or heteroaryl group may also be substituted with alkyl or alkoxy. For example, substituted aryl groups include methylphenyl and methoxyphenyl.

The term "alkenyl" refers to a radical composed entirely of carbon atoms and hydrogen atoms which contains at least one carbon-carbon double bond. An alkenyl radical may be linear or branched.

The term "alkynyl" refers to a radical composed entirely of carbon atoms and hydrogen atoms which contains at least one carbon-carbon triple bond. An alkynyl radical may be linear or branched.

The molar ratio of the unsaturated organoamine to the palladium salt may be from about 1:5 to about 10:1. For example, the molar ratio of unsaturated organoamine to palladium salt is from about 1:1 to about 10:1, or from about 2:1 to about 10:1, or from about 2:1 to about 5:1.

The unsaturated organoamine(s) present in the first composition may be immiscible in water. Generally, water immiscible unsaturated organoamines contain at least about 4 carbon atoms per amine group. For example, water immiscible unsaturated organoamines include primary aliphatic amines of the formula $NH_2\text{—}R^3$, where $R^3$ is alkenyl having from about 4 to about 25 carbon atoms, or from about 8 to about 18, for example $R^3$ may be a linear alkenyl chain. Secondary aliphatic amines may also be water immiscible, such as those of the formula $NHR^4R^5$, where at least one of $R^4$ and $R^5$ is alkenyl having from about 4 to about 25 carbon atoms, or form about 8 to about 18 carbon atoms. Tertiary aliphatic amines may also water immiscible, such as those of the formula $NR^6R^7R^8$, where at least one of $R^6$, $R^7$, and $R^8$ are independently alkenyl having from about 4 to about 25 carbon atoms, or from about 8 to about 18 carbon atoms.

The unsaturated organoamine may function as a solvent, with the palladium salt being dissolved in the unsaturated organoamine. The unsaturated organoamine should thus be in the liquid phase. The molar ratio of the unsaturated organoamine to the palladium salt may be at least about 2:1 to ensure dissolution of the palladium salt in the unsaturated organoamine.

However, this does not mean the unsaturated organoamine must have a melting point less than about room temperature. The temperature of the first composition may be greater than room temperature in order for the unsaturated organoamine to be in the liquid phase. For example, the unsaturated organoamine may have a melting point less than about 50° C., or a melting point of less than about 40° C., including a melting point less than room temperature. The liquid phase/low melting point is advantageous in achieving a uniform palladium layer. For example, an unsaturated organoamine with a high melting point may crystallize out after deposition, which may cause high surface roughness and holes in the final palladium layer.

In forming the second composition, the temperature of the first composition may be warmed from room temperature up to about 160° C., including from room temperature to about 150° C., or including from room temperature to about 110° C. At least a portion of this temperature may occur with no external heat source, for example due to an exothermal reaction between the palladium salt and the unsaturated organoamine. The warming can be performed for example from about 0.1 seconds to about 4 hours, including from 0.1 seconds to about 60 min, or from about 5 seconds to about 30 min.

The unsaturated organoamine is not required to be the sole solvent of the first composition. The first composition may also comprise a second solvent to dissolve the palladium salt and/or the unsaturated organoamine, for example, when the palladium salt does not completely dissolve in the unsaturated organoamine solvent. Another organic solvent, which may be immiscible with water, may be included. Water immiscible means, for example, when a given organic solvent is mixed with water at about equal amounts by volume, if a phase separation is detected (either visually or by instruments such as light scattering or refractive index) after settling, the solvent is considered to be water immiscible. The palladium salt, the unsaturated organoamine, and the resulting palladium unsaturated organoamine complex and palladium nanoparticles should be soluble in this second solvent. For example, at least about 0.5 wt % of the amount of the given component added to the second solvent should dissolve, including at least about 1 wt %, or at least about 10 wt % of the amount added. The non-soluble portion may be removed from the first composition by, for example, filtration.

Any suitable water immiscible organic solvent may be used for the second solvent. The second organic solvent may be, for example, a hydrocarbon solvent, for example a substituted hydrocarbon, an aromatic hydrocarbon, a ketone, ester, ether, and the like. The hydrocarbon solvent may, for example have at least 6 carbon atoms, from 6 to about 25 carbon atoms. For example, the solvent may be include toluene, xylene, mesitylene, ethylbenzene, diethylbenzene, trimethyl benzene, methyl ethylbenzene, tetrahydronaphthalene, chlorobenzene, dichlorobenzene, trichlorobenzene, chlorotoluene, methyl isobutyl ketone, methyl benzoate, benzyl benzoate, anisole, cyclohexanone, acetophenone, decalin, heptane, hexane, benzene, cyclohexane, pentane, octane, decane, dodecane, and the like, or mixtures thereof. The second organic solvent may have a boiling point of at least about 80° C., at least about 100° C., or at least 150° C.

Water and/or a water miscible solvent may be present in the first composition. Any suitable concentration of the water and/or water miscible solvent(s) may be present. For example, the amount of water and/or water miscible solvent (by weight) may be less than the amount of unsaturated organoamine. Examples of water miscible solvents include alcohols such as methanol, ethanol, propanol, and butanol; glycols; acetone; tetrahydrofuran (THF); dichloromethane; ethyl acetate; dimethylformamide (DMF); dimethyl sulfoxide (DMSO); acetic acid; acetonitrile; and dioxane.

The unsaturated organoamine may also function as a reducing agent. Therefore, the first composition may, for example, not contain any additional reducing agents, or may be substantially free of additional reducing agents, other than the unsaturated organoamine, and additional reducing agents need not be separately added as an additional processing step. Examples of reducing agents that may, for example, be excluded in the first composition are formic acid and formic acid salts or esters, hypophosphites, hydrazines, ammonium compounds, amine borane compounds, alkali metal borohydrides, oxalic acid, alkali or alkaline earth sulfites, and the like.

The unsaturated organoamine may also function as a complexing agent. A complexing agent refers, for example, to a compound that is attached to the central atom of a coordination compound. A coordination compound refers, for example, to a compound formed from the union of a metal ion with a nonmetallic complexing agent.

The second composition comprising palladium nanoparticles with a stability of at least 1 day and an unsaturated organoamine complex may form at room temperature without any warming. In order to speed the formation of a second composition comprising stable palladium nanoparticles and an unsaturated organoamine complex, the first composition may be warmed to a temperature of about 30° C. to about 150° C., for example, 30° C. to about 100° C., such as 30° C. to about 80° C. or less. This elevated temperature may be achieved through warming via an external heat application, through an exothermic reaction between the at least one palladium salt and the at least one unsaturated organoamine, or a combination of both.

The first composition may be warmed to the above-described temperature for a period of about 0.1 seconds to about 60 minutes, for about 1 second to about 45 minutes, or from about 10 seconds to about 30 minutes, in order to form palladium nanoparticles.

Warming may occur from the application of heat from an external heat source, for example, a hot plate, Bunsen burner, oven, microwave, water bath, warm air, IR irradiation, or the like, and combinations thereof. In addition, at least a portion of the warming may occur with no external heat source applied, for example, due to an exothermic reaction between the palladium salt and the unsaturated organoamine.

During the warming, at least a portion of the palladium salt and unsaturated organoamine react to from palladium nanoparticles and a palladium unsaturated organoamine complex. For example, a majority of the unsaturated organoamine and palladium salts react to form palladium nanoparticles and a palladium unsaturated organoamine complex. The molar ratio of the palladium unsaturated organoamine complex to the palladium nanoparticle may be from about 99:1 to about 1:99, including from about 90:10 to about 10:99, or from about 60:40 to about 40:60, based on the mole of palladium atom. The formation of palladium nanoparticles is evidenced, for example, by a color change of the unsaturated organoamine upon warming. For example, a black color may be observed, indicating that palladium nanoparticles have been formed during the warming step.

The warming of the first composition forms a second composition comprising palladium nanoparticles and a palladium unsaturated organoamine complex. The second composition may also comprise ingredients of the first composition, for example, a solvent and may also contain non-complexed unsaturated organoamine and/or non-complexed palladium salt, for example, due to an incomplete reaction of the first composition. The unsaturated organoamine from the first composition may contribute to the stability of the palladium nanoparticles in the second composition.

The second composition may be in the form of a liquid or a semisolid, such as a paste. The second composition may have a viscosity of about 5 cps to about 5,000 cps, for example from about 5 cps to about 2,500 cps, or from about 5 cps to about 1,000 cps at room temperature, from about 5 cps to about 50 cps at room temperature. For example, the second composition may be a paste with a viscosity of at least about 100 cps. Viscosity is determined, for example with rheometers such as Brook Field Rheometers at 25° C. with a rate sweep from 1000 $s^{-1}$ to 0.1 $s^{-1}$.

The palladium unsaturated organoamine complex may be of the formula:

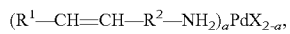

$(R^1-CH=CH-R^2-NH_2)_a PdX_{2-a}$, where $R^1$ and $R^2$ are the same as in the first composition, X represents a counter ion to palladium, and "a" represents the number of the unsaturated organoamine(s) complexed with palladium and can be any number larger than 0 but not greater than 2. For example, "a" may be about 2. X in the palladium unsaturated organoamine complex may be, for example, $R'COO^-$, $Cl^-$, $Br^-$, $I^-$, $NO_3^-$, $SO_4^{2-}$, $HCO_3$ cyanide, acetylacetonato, nitro, or a mixture thereof, wherein R' is a hydrocarbon group comprising 1 to about 18 carbon atoms.

Without being limited by this theory, it is theorized that the double bond of the unsaturated organoamine may contribute to the formation of stable palladium nanoparticles. The unsaturated organoamine will reduce the palladium salt to form nanoparticles; meanwhile the amino group of the unsaturated organoamine will interact with the surface of the nanoparticle immediately after their formation to prevent aggregation of the nanoparticles. In other words, the unsaturated organoamine provide dual functionality, reducing the palladium salt and as stabilizer for the palladium nanoparticles. In addition, the second composition may further comprise at least one unsaturated organoamine. Previously described palladium nanoparticles would combust when exposed to air or aggregate in the second composition. Furthermore, previously described palladium nanoparticles typically required the addition of a second reducing agent which is different from the stabilizer to form the palladium nanoparticles.

In embodiments, the palladium nanoparticle has a particle size less than 100 nm, or less than 50 nm, or less than 20 nm. For example from about 1 nm to about 100 nm, including from about 1 nm to about 50 nm, or from 1 nm to about 20 nm, as determined by TEM.

The palladium should not be considered as a catalyst, for example, as in an organic synthesis reaction. When an organic synthesis reaction contains an unsaturated organoamine reagent, a palladium unsaturated organoamine complex may be formed in the organic reaction. This differs from the present disclosure in several aspects. First, the palladium in a synthesis reaction functions as a catalyst, while the palladium in the present first and second compositions provides a metal source for a palladium coating or layer, and does not act as a catalyst. A catalyst refers, for example, to any substance of which a small proportion notably affects the rate of a chemical reaction without itself being consumed or undergoing a chemical change. Second, the organoamine in a synthesis reaction functions as a reactant, while the unsaturated organoamine in the first composition functions as a complexing agent, reducing agent, and/or solvent. Third, palladium is used in a catalytic amount in synthesis reactions, while palladium salt is merely one of the dominant components of the first composition. In general, the present disclosure describes a first and second composition that are non-catalytic compositions. For example, the palladium unsaturated organoamine complex is not used in forming a product from two reactants and the unsaturated organoamine does not become part of a third compound.

After the formation of the second composition comprising palladium nanoparticles and the palladium unsaturated organoamine complex, the nanoparticles may be stored for future use or may be immediately deposited on a substrate to form, for example, a palladium layer. The palladium nanoparticles need not be isolated from the second composition in order to store or use the second composition.

The second composition may be stored under ambient conditions. For example, the second composition may be stored at room temperature. When stored, the palladium nanoparticles in the second composition may have a stability of at least 1 day, such as, for example, a stability of at least 1 week, at least 1 month, or at least 6 months. Stability can be measured, for example, by visual inspections. For example, when the second composition becomes unstable, the palladium nanoparticles may aggregate. This aggregation may be observed by visual inspection.

In depositing the second composition, the palladium nanoparticles may optionally be isolated from the second composition and deposited on the substrate. However, isolation of the nanoparticles from the second composition is not necessary in order to form a palladium layer on the substrate.

The substrate may be, for example, a metal substrate, for example, copper, silver, aluminum, and nickel, a plastic substrate, for example, polyester, polyimide, polyketone, polysulfone, epoxy, and phenolic resin, and other substrates, for example, glass, paper, and ceramic, and the like, or mixtures thereof.

In depositing the second composition, a receiving layer can be applied prior to depositing the second composition on the substrate. The receiving layer may enhance the adhesion of the second composition on the object. Any suitable receiving layer can be used, for example, a receiving layer formed from a silane, or a silane comprising an amino group.

The depositing of the second composition, and/or the optionally the isolated nanoparticles, may be performed for example, by solution depositing. Solution depositing, for example, refers to a process where a liquid is deposited upon the substrate to form a coating or layer. This is in contrast to vacuum depositing processes. The present processes for forming a palladium layer are also different from other solution-based processes, for example electroplating, which requires a plate to remain immersed in a solution and also requires exposure to an electric current to form a metal coating on the plate. The present process also offers several advantages compared to other process such as the decreasing the amount of waste and decreasing the amount of time necessary to coat a substrate. Solution depositing includes, for example, spin coating, dip coating, spray coating, slot die coating, flexographic printing, offset printing, screen printing, gravure printing, or inkjet printing the palladium second composition onto the substrate.

The second composition may be spin coated and/or the optionally the isolated nanoparticles, for example, for about 10 to about 1,000 seconds, for about 50 seconds to about 500 seconds, or from about 100 seconds to about 150 seconds, onto a substrate at a speed, for example, from about 100 revolutions per minute (rpm) to about 5,000 rpm, from about 300 rpm to about 3,000 rpm, or from about 500 rpm to about 1,500 rpm.

The substrate coated with the second composition and/or isolated palladium nanoparticles is then heated to form a palladium layer on the substrate. The heating may be performed at any temperature that does not cause adverse changes in the properties of the previously deposited layer(s) or the substrate (whether a single layer substrate or multilayer substrate), for example, from about 60° C. to about 350° C., from about 90° C. to about 350° C., from about 100° C. to about 300° C., or from about 150° C. to about 250° C. The heating may be performed for a period of up to 60 minutes, and could be for a period as short as 0.1 seconds depending on the size of the palladium layer and the heating method. For example, the period of heating may be from about 0.1 second to about 30 minutes, from about 1 second to about 20 minutes, or from about 1 minute to about 10 minutes.

The heating may be performed in air, in an inert atmosphere (for example, under nitrogen or argon), or in a reducing atmosphere (for example, under nitrogen containing from 1 to about 20 percent by volume hydrogen). The heating can also be performed under normal atmospheric pressure or at a reduced pressure of, for example, from about 1,000 millibars to about 0.01 millibars. Examples of heating techniques may include thermal heating (for example, a hot plate, an oven, and a burner), infra-red ("IR") radiation, a laser beam, flashlight, microwave radiation, or UV radiation, or a combination thereof. This liquid deposition process for forming the palladium layer is different from a conventional electroless plating process, where the palladium salt deposits into a palladium layer directly without going through a nanoparticle intermediate form. The heating causes the palladium nanoparticles to coalesce into a continuous and uniform palladium layer. The palladium nanoparticles enhance uniformity of the final palladium film. The heating induces the palladium nanoparticles to form, for example, an electrically conductive layer, which is suitable for use as an electrically conductive element in electronic devices.

The deposition processes described above may also be repeated to build up a thicker palladium layer on the object. For example, the thickness of the final layer may also be from about 10 nanometers to about 50 micrometers, or from about 50 nanometers to about 30 micrometers, or from about 50 nm to about 5 micrometers, or from about 80 nm to about 1 micrometer. In this regard, multiple solution deposition steps may be performed, with one subsequent heating to form the final layer. Alternatively, the steps of solution deposition followed by heating can be repeated multiple times to build a thick layer out of several thinner layers.

The palladium layer deposited on the substrate may be electrically conductive, and may, for example, be deposited in a predetermined pattern, such as an electrically conductive pathway or circuit on a substrate. The palladium layers produced according to the present disclosure have high conductivity and good adhesion at low temperatures. For example, the conductivity of the palladium layer produced by heating is, for example, from about 100 Siemens/centimeter ("S/cm") to about 50,000 S/cm, from about 1,000 S/cm to about 10,000 S/cm, such as from about 2,000 S/cm, to about 5,000 S/cm, or for example, the conductivity may be at least 1,000 S/cm. Conductivity was measured using the 4-probe method at room temperature.

The palladium layer also may not be electrically conductive. Although heating causes the decomposition of the second composition into palladium film or layer, due to the presence of other ions, for example, from the salt, a residual amount of the unsaturated organoamine and its decomposed form, and/or due to the presence of insulative additives in the first composition such as polymers, the palladium layer may not be conductive.

If desired, additional layers can be applied on top of the palladium layer (the additional layers may be referred to, for example, as overcoat layers). Any layer known in the art may be applied, for example, materials with resistance to scratching. Materials that may be used to form an overcoat layer include, for example, an epoxy resin, a polyurethane, a phenol resin, a melamine resin, a polysiloxane, a poly(silsesquioxane), and the like. Polysiloxane and poly(silsesquioxane) (for example sol-gel approach) can be used to from a highly crosslinked polysiloxane or poly(silsesquioxane) overcoat layer. The overcoat layer may be a crosslinked polysiloxane, a crosslinked poly(silsesquioxane), or a crosslinked layer comprising poly(vinylphenol) and a melamine-formaldehyde resin. The thickness of the overcoat layer may be for example from about 10 nm to about 10 micrometers, including from about 10 nm to about 5 micrometers, or from about 50 nm to about 1 micrometer. The overcoat layer may be colorless to ensure the visibility of the palladium layer.

In addition, the palladium layer has a surface roughness less than about 10 nm, for example, from about 1 nm to about 10 nm, from about 2 nm to about 9 nm, or from about 3 nm to about 8 nm. Surface roughness may be determined by any suitable method. Exemplary methods including Atomic Force Microscope, Surface Profilometer, Optical Profilometer, and the like.

FIG. 1 is a schematic diagram illustrating a process described herein. In step 100, a palladium first composition 10 is presented in a vessel 11. The vessel is warmed to a sufficient temperature to induce the formation of palladium nanoparticles 12. A wire 20 is drawn through the coating solution to form a coating 22 on the wire. Any wire could be coated with the palladium second composition, regardless of the diameter, shape, or length of the wire. Both organic materials, for example, plastics, such as polyimide, polyester, polyamide (Nylor), polycarbonate, polyethylene, polyacrylate, and the like and inorganic materials, for example, copper, aluminum, tungsten, zinc oxide, silicon, and the like may be used as the substrate for the wire. The wire may be bare, for example, uncovered with other layers, or may be insulated by the addition of other layers around a core. The wire may be single-stranded, multiple stranded, and/or twisted.

Next in step 200, the coating 22 is annealed by exposure to heat. The result is a wire 30 having a palladium layer 31. The original wire 20 serves as a substrate upon which the palladium layer is located.

Figure 2:
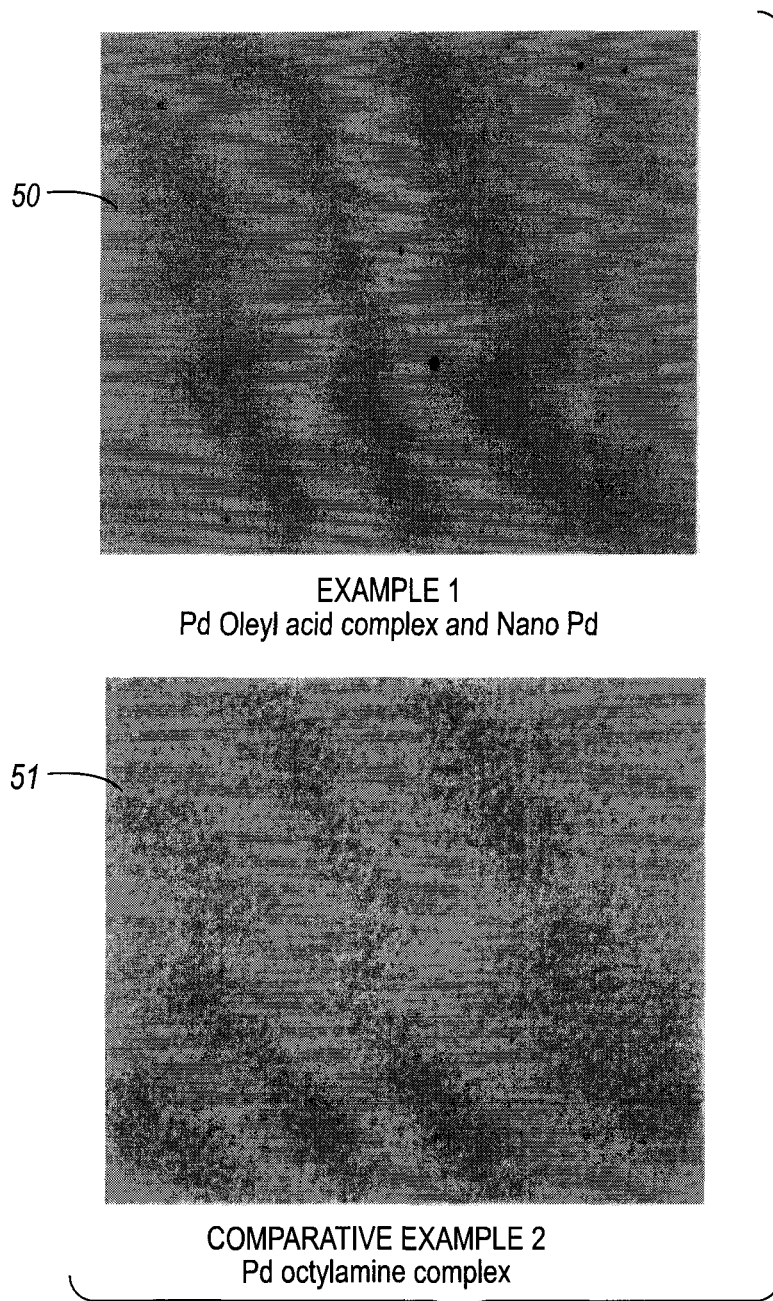
FIG. 2 is a picture of palladium film prepared according to the present disclosure compared with a palladium saturated organoamine complex without palladium nanoparticles.

FIG. 2 is a picture of palladium film prepared according to the present disclosure 50 compared with a palladium film produced with a first composition containing a saturated palladium organoamine complex without palladium nanoparticles 51.

The palladium film prepared by the present disclosure is very smooth and without porosity. On the other hand, the film produced by a first composition containing a saturated palladium organoamine complex without palladium nanoparticles may result in textured surfaces with some porosity.

EXAMPLES

The following examples are for purposes of further illustrating the present disclosure.

Example 1

Palladium acetate (trimer) was purchased from Alfa Aesar. 0.1 grams of palladium acetate, 0.2 grams toluene and 0.2 grams of oleylamine were mixed together to form a first composition. The mixture was warmed to about 60° C. and stirred for about 30 minutes. Upon heating, the solution became a dark color, indicating the formation of palladium nanoparticles in a second composition.

The second composition was spin coated on a glass substrate at 1,000 rpm, resulting in an amorphous film. Annealing was performed after spin coating at about 220° C. to about 250° C. on a hotplate until a shiny, silver color metal film was formed on the substrate.

The palladium film showed very good scratch resistance and excellent adhesion. The conductivity, when measured using the 4-probe method, was $6.5 \times 10^4$ S/m.

Example 2

The first composition was prepared similar to Example 1, except that 0.2 g of decalin was used as the solvent. A copper wire was dipped in the first composition for a few seconds, followed by annealing in an oven at about 220° C. to about 250° C. A very robust and shiny palladium coating was formed on the copper wire.

Comparative Example 1

Palladium acetate (trimer) was purchased from Alfa Aesar. 0.1 grams of palladium acetate was added into 0.7 grams toluene. 0.22 grams of octylamine, a saturated organoamine, was then added into the mixture, and the mixture was then shaken. The insoluble part of the palladium salt was dissolved to form a very stable light yellow solution. However, no nanoparticles were present in this solution after warming up the solution to 100° C.

Comparative Example 2

Silver acetate was purchased from Alfa Aesar. 0.1 grams of silver acetate was added into 0.2 grams toluene. 0.22 grams of oleylamine, an unsaturated organoamine, was added into the mixture. The mixture was warmed to about 60° C. and stirred for about 30 minutes. No silver nanoparticles were formed.

It will be appreciated that variations of the above-disclosed and other features and functions, or alternatives thereof, may be desirably combined into many other different systems or applications. Also, various presently unforeseen or unanticipated alternatives, modifications, variations or improvements therein may be subsequently made by those skilled in the art, and are also intended to be encompassed by the following claims.

What is claimed is:

1. A method comprising:
warming a first composition comprising at least one palladium salt and at least one unsaturated organoamine to form a second composition comprising stable palladium nanoparticles and at least one palladium unsaturated organoamine complex, wherein the first composition is substantially free of an additional reducing agent.

2. The method of claim 1, wherein the unsaturated organoamine of the first composition is of the formula:

$$R^1—CH=CH—R^2—NH_2,$$

wherein $R^1$ represents a hydrogen or a hydrocarbon group having from about 1 carbon atom to about 25 carbon atoms, and $R^2$ represents a hydrocarbon group having from about 1 to about 25 carbon atoms, wherein the hydrocarbon group of $R^1$ and/or $R^2$ is independently selected from the group consisting of a substituted or unsubstituted alkyl, alkenyl, alkynyl, aryl and mixtures thereof, wherein the palladium salt of the first composition is of the formula:

$$Pd(X)_2,$$

wherein X is any counter ion to palladium, or mixture thereof, and wherein the palladium unsaturated organoamine complex of the second composition may be of the formula:

$$(R^1—CH=CH—R^2—NH_2)_aPdX_{2-a},$$

wherein a represents the number of the unsaturated organoamine(s) complexed with palladium and can be any number larger than 0 but not greater than 2.

3. The method of claim 1, wherein the second composition further comprises the at least one unsaturated organoamine, wherein the palladium nanoparticles are stabilized with the unsaturated organoamine, and the nanoparticles have stability at least 1 day.

4. The method of claim 1, wherein the first composition further comprises a hydrocarbon solvent.

5. The method of claim 1, wherein the at least one unsaturated organoamine is a solvent.

6. The method of claim 1, wherein the palladium salt is selected from the group consisting of a palladium carboxylate, palladium chloride, palladium nitrate, palladium sulfate, palladium iodide, palladium cyanide, ethylenediamine palladium chloride, tetraaminepalladium bromide, bis(acetylacetonato)palladium, diamine dinitro palladium, and a mixture thereof, wherein the palladium salt is from about 1 to about 50 weight percent of the first composition, and wherein the molar ratio of the unsaturated organoamine to the palladium salt is from about 1:5 to about 10:1.

7. The method of claim 1, wherein the first composition is warmed to a temperature of less than about 150° C. and wherein the warming is performed for a period of from about 0.1 seconds to about 60 minutes.

8. The method of claim 1 further comprising:
solution depositing the second composition upon a substrate; and
heating the second composition to form a palladium layer on the substrate.

9. The method of claim 8, wherein the solution depositing comprises spin coating, dip coating, spray coating, slot die coating, flexographic printing, offset printing, screen printing, gravure printing, or inkjet printing the second composition onto the substrate.

10. The method of claim 8, wherein the heating is performed at a temperature of about 90° C. to about 350° C. for a period of from about 1 second to about 1 hour.

11. The method of claim 8, wherein the palladium layer has a conductivity at least about 1,000 S/cm and has a surface roughness less than about 10 nm.

12. A composition comprising at least one palladium unsaturated organoamine complex and palladium nanoparticles, the composition having a stability of at least 1 day.

13. The composition of claim 12, the composition further comprising an unsaturated organoamine, wherein the palladium nanoparticles are stabilized with the unsaturated organoamine.

14. The composition of claim 12, wherein the unsaturated organoamine in the palladium unsaturated organoamine complex is selected from the group consisting of oleylamine, allylamine, geranylamine, N-methylallylamine, diallylamine, 2-(1-cyclohexenyl)ethylamine, 3-pyrroline, 1,2,3,6-tetrahydropyridine, N-methyl-2-methylallylamine, and mixtures thereof.

15. The composition of claim 12, wherein the molar ratio of the palladium unsaturated organoamine complex to the palladium nanoparticle is from about 99:1 to about 1:99, based on the mole of palladium atom, and wherein the at least one palladium unsaturated organoamine comprises a counter ion selected from the group consisting of R'COO⁻, Cl⁻, Br⁻, I⁻, $NO_3^-$, $SO_4^{2-}$, $HCO_3$ cyanide, acetylacetonato, nitro, and mixtures thereof, wherein R' is a hydrocarbon group comprising 1 to about 18 carbon atoms.

16. The composition of claim 12, wherein the composition is substantially free of an additional reducing agent other than the unsaturated organoamine.

17. The composition of claim 12, wherein the composition has a viscosity from about 5 cps to about 5,000 cps at room temperature.

18. A composition comprising at least one palladium unsaturated organoamine complex and stable palladium nanoparticles, formed by a process of:
    warming a first composition comprising at least one palladium salt and at least one unsaturated organoamine to form a second composition comprising the at least one palladium unsaturated organoamine complex and palladium nanoparticles, wherein the first composition is substantially free of an additional reducing agent.

19. The composition of claim 18, wherein the second composition further comprises the at least one unsaturated organoamine, the palladium nanoparticles being stabilized with the unsaturated organoamine, and the palladium nanoparticles have stability of at least 1 day.

20. The composition of claim 18, wherein the unsaturated organoamine comprises at least 2 carbon atoms to about 25 carbon atoms.

21. The composition of claim 18, wherein the first composition is warmed to a temperature of less than about 150° C. for a period of from about 0.1 seconds to about 60 minutes.

22. The composition of claim 18, wherein the palladium salt is from about 1 to about 50 weight percent of the first composition, and wherein the molar ratio of the unsaturated organoamine to the palladium salt is from about 1:5 to about 10:1.

\* \* \* \* \*